US010761208B2

United States Patent
Kim et al.

(10) Patent No.: US 10,761,208 B2
(45) Date of Patent: Sep. 1, 2020

(54) BEAM FORMING DEVICE AND SYSTEM INCLUDING THE SAME

(71) Applicant: Seoul National University R&DB Foundation, Seoul (KR)

(72) Inventors: Suhwan Kim, Seoul (KR); Taehoon Kim, Seoul (KR)

(73) Assignee: Seoul National University R&DB Foundation, Seoul (KR)

(*) Notice: Subject to any disclaimer, the term of this patent is extended or adjusted under 35 U.S.C. 154(b) by 337 days.

(21) Appl. No.: 16/010,314

(22) Filed: Jun. 15, 2018

(65) Prior Publication Data

US 2018/0306918 A1    Oct. 25, 2018

Related U.S. Application Data

(63) Continuation of application No. PCT/KR2016/007612, filed on Jul. 13, 2016.

(30) Foreign Application Priority Data

Dec. 17, 2015  (KR) .................. 10-2015-0181045

(51) Int. Cl.
    *G01S 15/89*    (2006.01)
    *G01S 7/53*     (2006.01)
    (Continued)

(52) U.S. Cl.
    CPC .......... *G01S 15/89* (2013.01); *G01S 7/5208* (2013.01); *G01S 7/52025* (2013.01); *G01S 7/53* (2013.01);
    (Continued)

(58) Field of Classification Search
    CPC .... G01S 15/89; G01S 7/5208; G01S 15/8915; G01S 7/52025; G01S 7/53; G10K 11/346; H03M 1/1245; H03M 1/123; H03M 1/183
    See application file for complete search history.

(56) References Cited

U.S. PATENT DOCUMENTS 7,113,116 B2   9/2006  Brewer et al.
8,742,963 B2   6/2014  Zou et al.
(Continued)

FOREIGN PATENT DOCUMENTS

JP    2015-073902      4/2015
KR    10-2012-0080093  7/2012
(Continued)

OTHER PUBLICATIONS

Savord et al., "Fully sampled matrix transducer for real time 3D ultrasonic imaging," in Proc. 2003 IEEE Ultrasonics Symposium, pp. 945-953.
(Continued)

*Primary Examiner* — Daniel Pihulic
(74) *Attorney, Agent, or Firm* — Fish & Richardson P.C.

(57) ABSTRACT

The present technology provides a beam forming device for performing both analog beam forming and analog-to-digital conversion. The present invention provides a probe having a beam forming device therein, and a system comprising the same. A beam forming device, according to the present technology, comprises: a signal storage circuit configured to receive the plurality of analog signals to store the analog beam signal corresponding to a combination of the plurality of analog signals; and a control circuit configured to control the signal storage circuit so that the signal storage circuit receives the plurality of analog signals and stores the analog beam signal, to generate a digital signal corresponding to the analog beam signal and to control the signal storage circuit (Continued)

so that an output voltage of the signal storage circuit is updated while the digital signal is being generated.

29 Claims, 9 Drawing Sheets

(51) Int. Cl.
    *H03M 1/12*     (2006.01)
    *H03M 1/18*     (2006.01)
    *G01S 7/52*     (2006.01)
    *G10K 11/34*     (2006.01)

(52) U.S. Cl.
    CPC ........ *G01S 15/8915* (2013.01); *G10K 11/346* (2013.01); *H03M 1/123* (2013.01); *H03M 1/1245* (2013.01); *H03M 1/183* (2013.01)

(56) References Cited

U.S. PATENT DOCUMENTS

| | | |
|---|---|---|
| 2008/0262351 A1 | 10/2008 | Scampini |
| 2013/0063290 A1 | 3/2013 | Zou et al. |
| 2014/0232582 A1 | 8/2014 | Lian et al. |
| 2018/0306918 A1* | 10/2018 | Kim ..................... G10K 11/346 |
| 2020/0186157 A1* | 6/2020 | Kim ..................... H03M 1/001 |

FOREIGN PATENT DOCUMENTS

| | | | |
|---|---|---|---|
| KR | 10-2012-0121230 | 11/2012 | |
| KR | 10-2013-0032163 | 4/2013 | |
| KR | 10-1263192 | 5/2013 | |
| KR | 10-2013-0068529 | 6/2013 | |
| KR | 101626876 B1 * | 6/2016 | ......... G01S 15/8915 |
| WO | WO-2017104923 A1 * | 6/2017 | ............. G01S 15/89 |

OTHER PUBLICATIONS

International Preliminary Report on Patentability in PCT Appln. No. PCT/KR2016/0007612, dated Jun. 19, 2018, with English translation.

International Search Report and Written Opinion in PCT Appln. No. PCT/KR2016/0007612, dated Oct. 18, 2016, with English translation.

\* cited by examiner

BEAM FORMING DEVICE AND SYSTEM INCLUDING THE SAME

CROSS-REFERENCE TO RELATED APPLICATIONS

This application is a continuation of and claims priority to PCT Application No. PCT/KR2016/007612, filed on Jul. 13, 2016, which claims priority to Korean Patent Application No. 10-2015-0181045, filed on Dec. 17, 2015, the entire contents of which are incorporated by reference.

TECHNICAL FIELD

The present disclosure may generally relate to a beam forming device and a system including the beam forming device, and more particularly, to a beam forming device capable of performing an analog beam forming operation and an analog digital converting operation together and a system including the beam forming device.

BACKGROUND

FIG. 1 is a block diagram showing a conventional ultrasonic diagnostic system.

A conventional ultrasonic diagnostic system includes a probe 10, a main body 20, and a cable 30.

The probe 10 includes a plurality of transducers 11 and an analog beam former 13.

In FIG. 1, the probe 10 includes 64 transducers 11 and 8 analog beam formers 13.

The transducer 11 emits ultrasonic waves to a target point or a focal point F, according to a signal transmitted from the main body 20, receives reflected ultrasonic waves, and converts the reflected ultrasonic waves into analog electric signals.

In FIG. 1, 64 transducers 11 form sub-arrays in units of eight, but a number of transducers 11 included in a sub-array can be variously set to one or more.

The probe 10 may further include a plurality of analog signal regulators or analog front ends (AFEs) 12.

Maximum value of a signal output from each transducer 11 is different according to a channel. The analog signal regulator 12 controls a gain to amplify an output signal of a transducer 11 to a predetermined magnitude and output an amplified signal.

The eight analog beam formers (ABFs) 13 perform a beam forming operation on the analog electric signals output from the eight analog signal regulators 12 corresponding to the eight sub-arrays and outputs analog beam signals.

An analog beam signal can be represented by a sum of analog signals whose time or phase difference has been removed.

The look-up table (LUT) 24 of the main body 20 can store delay information of each channel according to the focal point F in advance. The LUT 24 may also store amplification ratio of each analog signal regulator 12 in advance.

The controller 23 of the main body 20 reads delay information and amplification ratio for a selected target point F from the LUT 24 and outputs the delay information and the amplification ratio to the analog signal regulators 12 and analog beam formers 12 of the probe 10.

The analog beam former 13 performs a beam forming operation on the signals received from analog signal regulators 12 using the delay information.

The analog beam signals output from analog beam formers 13 are transmitted to the main body 20 through a cable 30.

In FIG. 1, the main body 20 includes eight analog-to-digital converters (ADCs) 21 and a digital beam former 22.

Each of the ADCs 21 converts an analog signal output from a corresponding analog beam former 13 and transmitted through the cable 30 into a digital signal and outputs the digital signal.

The digital beam former (DBF) 22 performs a beam forming operation on the digital signals output from the eight ADCs 21.

The controller 23 may generate an ultrasound diagnostic image according to a signal output from the digital beam former 22.

In this conventional ultrasonic diagnostic system, when a number of transducers 11 increases, a number of analog beam formers 13 and ADCs 21 increases correspondingly and a number signals transmitted through the cable 30 also increases.

A recent ultrasonic diagnostic system includes a total of 9216 transducers arranged in a matrix form having 72 rows and 128 columns.

Therefore, when one sub-array includes eight transducers 11, a total of 1152 ADCs 21 are required. As fewer transducers 11 are included in one sub-array, more ADCs 21 are required.

In addition, the conventional analog beam former 13 must include a buffer at the output stage for stably providing an analog beam signal to an ADC 21. Generally, the buffer can be implemented using an operational amplifier.

In this way, in the conventional ultrasonic diagnostic system, there is a problem that the cost increases as the number of the transducers 11 increases.

Moreover, there is a problem that quality of a signal is degraded in a process of transmitting a large number of analog beam signals to the main body 20 through the cable 30.

SUMMARY

Various embodiments are directed to a beam forming device that performs an analog beam forming operation and an analog-to-digital conversion operation together. Also, various embodiments are directed to a probe having a beam forming device and a system including the same.

According to an aspect of the present invention, a beam forming device may include a signal storage circuit configured to receive a plurality of analog signals to store an analog beam signal corresponding to a combination of the plurality of analog signals; and a control circuit configured to control the signal storage circuit so that the signal storage circuit receives the plurality of analog signals and stores the analog beam signal, to generate a digital signal corresponding to the analog beam signal and to control the signal storage circuit so that an output voltage of the signal storage circuit is updated while the digital signal is being generated.

According to another aspect of the present invention, a probe system may include a plurality of transducers configured to convert signals received from a plurality of channels to a plurality of analog signals; and a beam forming device configured to receive the plurality of analog signals and to output a digital signals which is a conversion of an analog beam signal corresponding to a combination of the plurality of analog signals, wherein the beam forming device may comprise: a signal storage circuit configured to receive the plurality of analog signals to store the analog beam signal corresponding to a combination of the plurality of analog signals; and a control circuit configured to control the signal storage circuit so that the signal storage circuit receives the plurality of analog signals and stores the analog beam signal, to generate a digital signal corresponding to the analog beam signal and to control the signal storage circuit so that an output voltage of the signal storage circuit is updated while the digital signal is being generated.

According to another aspect of the present invention, a system may include a probe including a plurality of transducers configured to convert signals received from a plurality of channels to a plurality of analog signals; and a plurality of beam forming device each configured to receive the plurality of analog signals and to output a digital signals which is a conversion of an analog beam signal corresponding to a combination of the plurality of analog signals; a cable configured to transmit a digital signal output from the probe; and a main body configured to analyze the digital signal received through the cable, wherein one of the plurality of beam forming devices may comprise: a signal storage circuit configured to receive the plurality of analog signals to store the analog beam signal corresponding to a combination of the plurality of analog signals; and a control circuit configured to control the signal storage circuit so that the signal storage circuit receives the plurality of analog signals and stores the analog beam signal, to generate a digital signal corresponding to the analog beam signal and to control the signal storage circuit so that an output voltage of the signal storage circuit is updated while the digital signal is being generated.

A beam forming device according to a present disclosure can perform an analog beam forming operation and an analog-to-digital conversion operation together. Thus, overall structure may be simplified relative to a conventional art where an analog beam former and an analog-to-digital converter are separated.

In a system including a beam forming device according to a present disclosure, digital communication between a probe and a main body is performed and therefore it is possible to reduce deterioration of a signal quality occurring in the process of transmitting analog beam signals through the cable.

In a beam forming device according to a present disclosure, a main body may directly receive and process a digital signal so that elements for processing analog signals may be omitted, and accordingly, size of the main body can be reduced to a portable size.

DETAILED DESCRIPTION

Hereafter, exemplary embodiments of the present invention will be described in detail with reference to the accompanying drawings.

Figure 2:
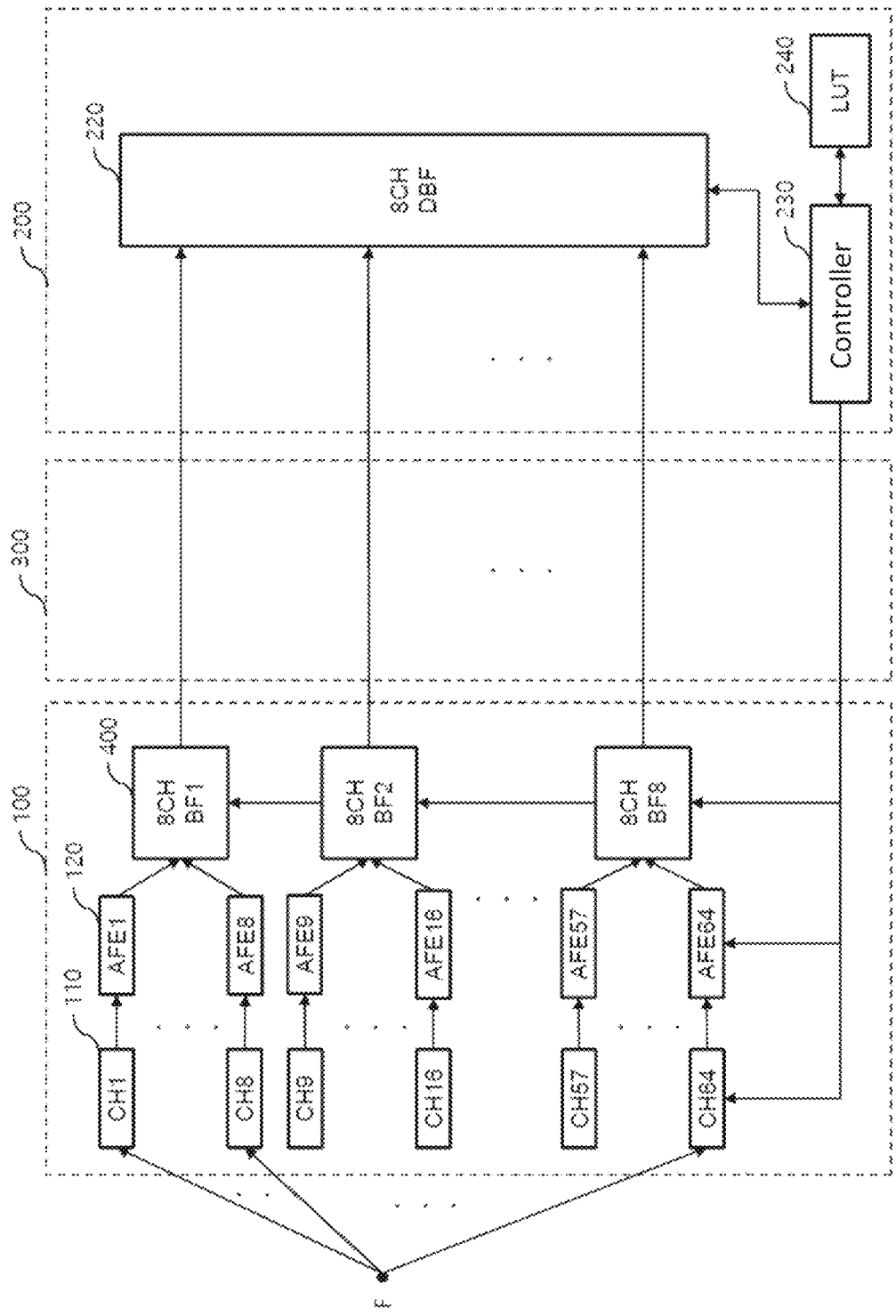
FIG. 2 is a block diagram illustrating an ultrasonic diagnostic system according to an embodiment of the present disclosure.

FIG. 2 is a block diagram illustrating an ultrasonic diagnosis system according to an embodiment of the present disclosure.

An ultrasonic diagnostic system according to an embodiment of the present disclosure includes a probe 100, a main body 200, and a cable 300.

The probe 100 includes a plurality of transducers 110 and a beam forming devices (BFs) 400.

A transducer 110 receives reflected ultrasonic waves and converts it into an analog electric signal for output.

In this embodiment, the plurality of transducers 110 form sub-arrays in units of eight, but a number of transducers 110 included in a sub-array may vary according to embodiments.

The probe 100 may further include a plurality of analog signal regulators or analog front ends (AFEs) 120.

Maximum value of a signal output from each transducer 110 is different from each other. The analog signal regulator 120 controls a gain to amplify an output signal of a transducer 110 to a predetermined magnitude.

The beam forming device 400 stores an analog beam signal corresponding to a combination of analog signals output from the analog signal regulator 120 included in one sub-array and outputs a digital signal converted from the analog beam signal.

The configuration and operation of the beam forming device 400 will be described in detail with reference to FIG. 3.

The cable 300 transmits digital signals output from the beam forming devices 400 to the main body 200.

The main body 200 includes a digital beam former (DBF) 220, a controller 230, and a look-up table (LUT) 240.

The digital beam former 220 receives digital signals output from the beam forming devices 400 through the cable 300, performs a beam forming operation, and outputs a digital beam forming signal.

The controller 230 may perform an operation of outputting an ultrasonic diagnostic image using the digital beam forming signal.

The operations of the controller 230 and the LUT 240 are substantially the same as those described in the related art, and a description thereof will be omitted.

In addition, the digital beam former 220 for receiving the digital signal and performing the beam forming operation and the controller 230 for generating an ultrasonic diagnostic image can be implemented by applying a conventional technique. Therefore, the detailed descriptions for the digital beam former 220 and the controller 230 is omitted.

Figure 1:
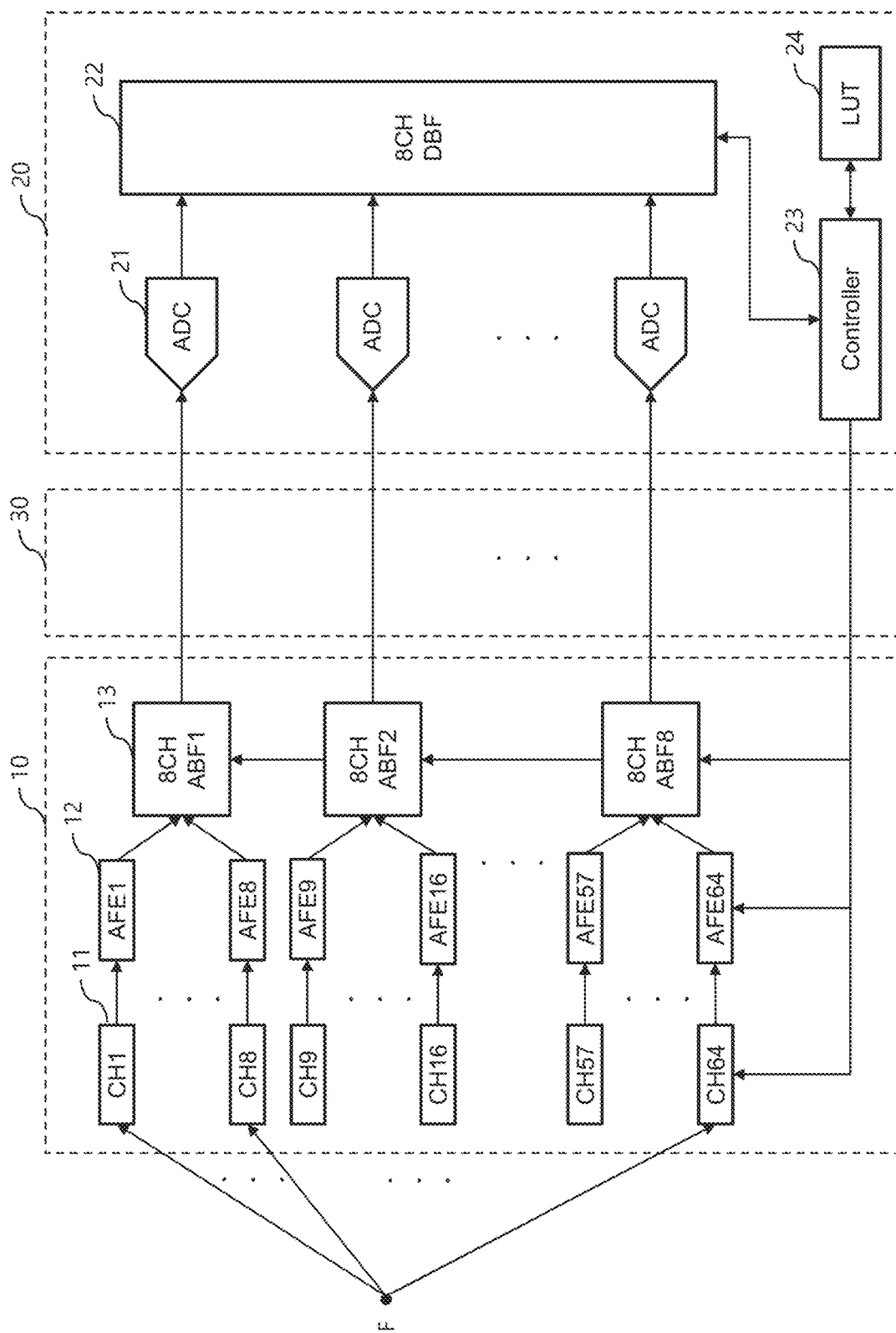
FIG. 1 is a block diagram illustrating a conventional ultrasonic diagnostic system.

The ultrasonic diagnostic system according to the present disclosure shown in FIG. 2 differs from the conventional ultrasonic diagnostic system shown in FIG. 1 like the following.

First, the probe 100 according to the present disclosure includes a beam forming device 400 instead of the conventional analog beam formers 13.

It is understood that the beam forming device 400 according to the present disclosure performs functions of the conventional analog beam former 13 and the conventional analog-to-digital digital converter ADC 21 together.

However, the beam forming device 400 according to the present disclosure does not merely combine the configurations of the conventional analog beam former 13 and the conventional ADC 21.

The specific configuration and operation of the beam forming device 400 according to the present disclosure will be described in detail with reference to FIG. 3.

The main body 200 according to the present disclosure does not include the ADC 21 unlike the conventional art, and the cable 300 according to the present disclosure transmits digital signals unlike the conventional art.

Figure 3:
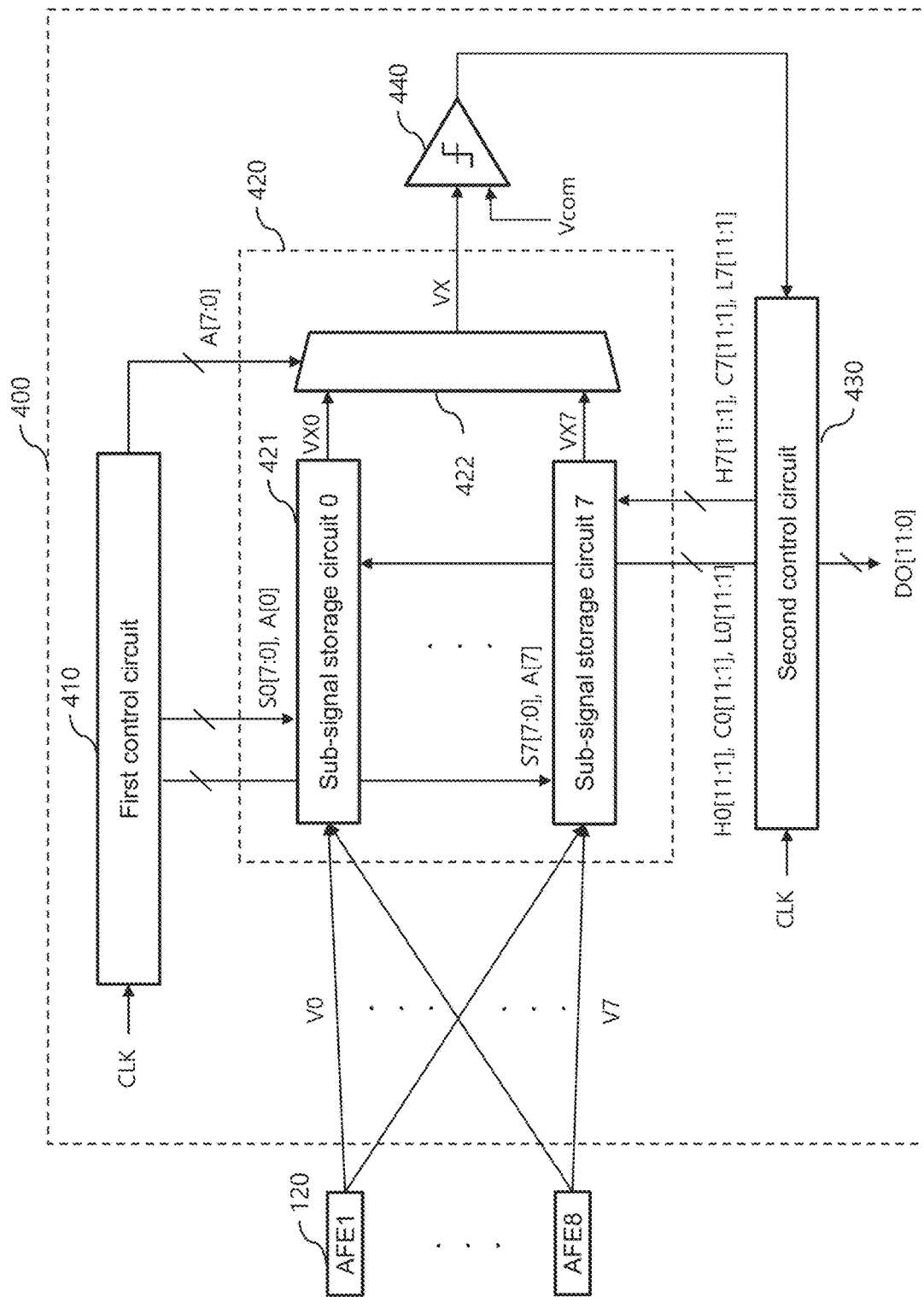
FIG. 3 is a block diagram illustrating a beam forming device of FIG. 2.

FIG. 3 is a block diagram illustrating a beam forming device 400 according to an embodiment of the present disclosure.

The beamforming device 400 includes a first control circuit 410, a signal storage circuit 420, a second control circuit 430, and a comparator 440.

In the present disclosure, the first control circuit 410 and the second control circuit 430 are shown separately, but this is for convenience of description and is not limited to being implemented as a separate physical block.

The first control circuit 410 stores voltage signals V0 to V7 provided from the analog signal regulator or the analog front end (AFE) 120 in the signal storage circuit 420.

For example, the first control circuit 410 controls the signal storage circuit 420 so that a switch is opened until a valid signal is no longer input from each channel in consideration of the delay time of the analog signals V0 to V7.

As a result, the signal storage circuit 420 stores an analog beam signal.

Hereinafter, an operation of storing an analog beam signal may be referred to as a sampling operation.

The analog beam signal can be understood as a combination of analog signals, and specific forms of combinations can be expressed in various mathematical formulas according to embodiments.

For example, the beam forming operation refers to an operation of adjusting delay of a plurality of analog signals to align phases and then summing them into a signal.

At this time, the delay may represent a time or a phase difference between received signals originating from a same ultrasonic wave.

In this case, an analog beam signal may be represented by a value corresponding to a sum of the analog signals whose time or phase difference has been removed.

The signal storage circuit 420 includes sub-signal storage circuits 421 and a selection circuit 422.

A specific configuration of the sub-signal storage circuit 421 will be described with reference to FIGS. 4 and 5.

A number of sub-signal storage circuits 421 may be one or more, and the number may be variously set according to embodiments.

In an embodiment including only one sub-signal storage circuit 421, the selection circuit 422 may not be included or may be replaced with a switch.

When there is one sub-signal storage circuit 421, a signal obtained as a result of sampling may be converted into a digital signal before the next sampling operation can be started. Therefore, this may be suitable for relatively low speed signal processing.

Each sub-signal storage circuit 421 samples a group of analog signals corresponding to ultrasonic waves reflected from the target point or the focal point F at a specific time.

The time taken for performing a sampling operation on a group of analog signals is longer than the time taken for converting a sampled analog signal into a digital signal.

Figure 8:
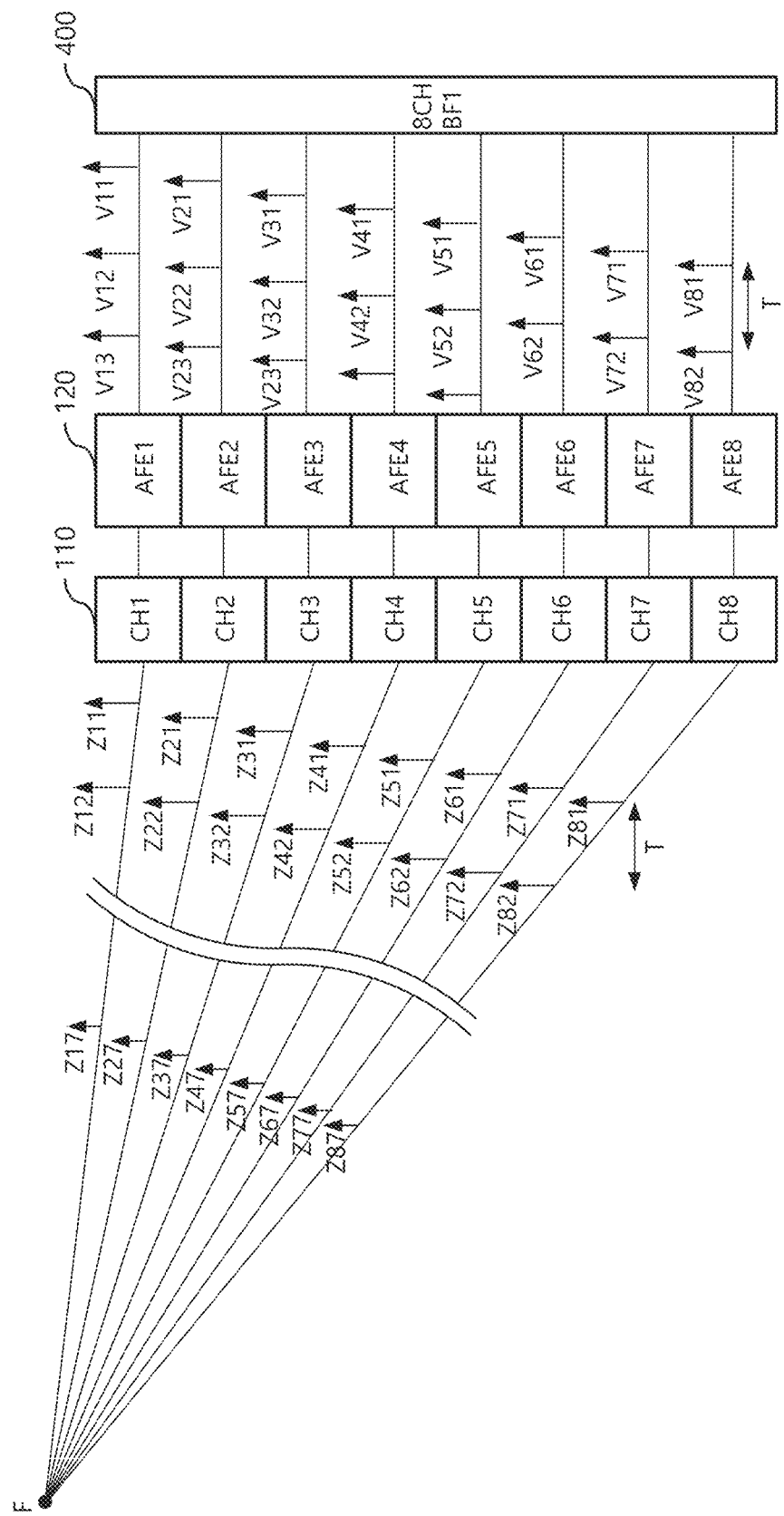
FIG. 8 is a diagram illustrating an operation of a beam forming device according to an embodiment of the present disclosure.

Accordingly, in order to perform the sampling operation and the analog-to-digital conversion operation for a group of analog signals input in sequence as shown in FIG. 8 at a higher speed, a plurality of sub-signal storage circuits 421 may be provided in parallel and they may be controlled to perform sampling operations and the analog-to-digital conversion operations according to a time interleaving method.

An example of an operation of performing a sampling operation and an analog-to-digital conversion operation according to a time interleaving method on a group of signals input in sequence by using a plurality of sub-signal storage circuits 421 will be described with reference to FIG. 9.

When an analog beam signal at a specific time is input to a sub-signal storage circuit 421 by a control of the first control circuit 410, the first control circuit 410 controls the selection circuit 422 so that a signal of a corresponding sub-signal storage circuit 421 may be input to the comparator 440.

Then, the second control circuit 430 controls the operation of converting the analog signal stored in the sub-signal storage circuit 421 to a digital signal.

Various conventional techniques are known as techniques for converting an analog signal into a digital signal.

The second control circuit 430 according to an embodiment of the present disclosure uses a technique for sequentially determining from the upper bits to the lower bits of a digital signal while comparing the output voltage VX of the signal storage circuit 420 with the reference voltage Vcom.

The beam forming apparatus 400 according to an exemplary embodiment of the present disclosure stores an analog beam signal in the signal storage circuit 420 through a sampling operation and directly performs an analog-to-digital conversion operation for the analog signal stored in the signal storage circuit 420 without using a buffer.

The first control circuit 410 and the second control circuit 430 may be implemented as a sequential circuit using a clock signal CLK.

Figure 4:
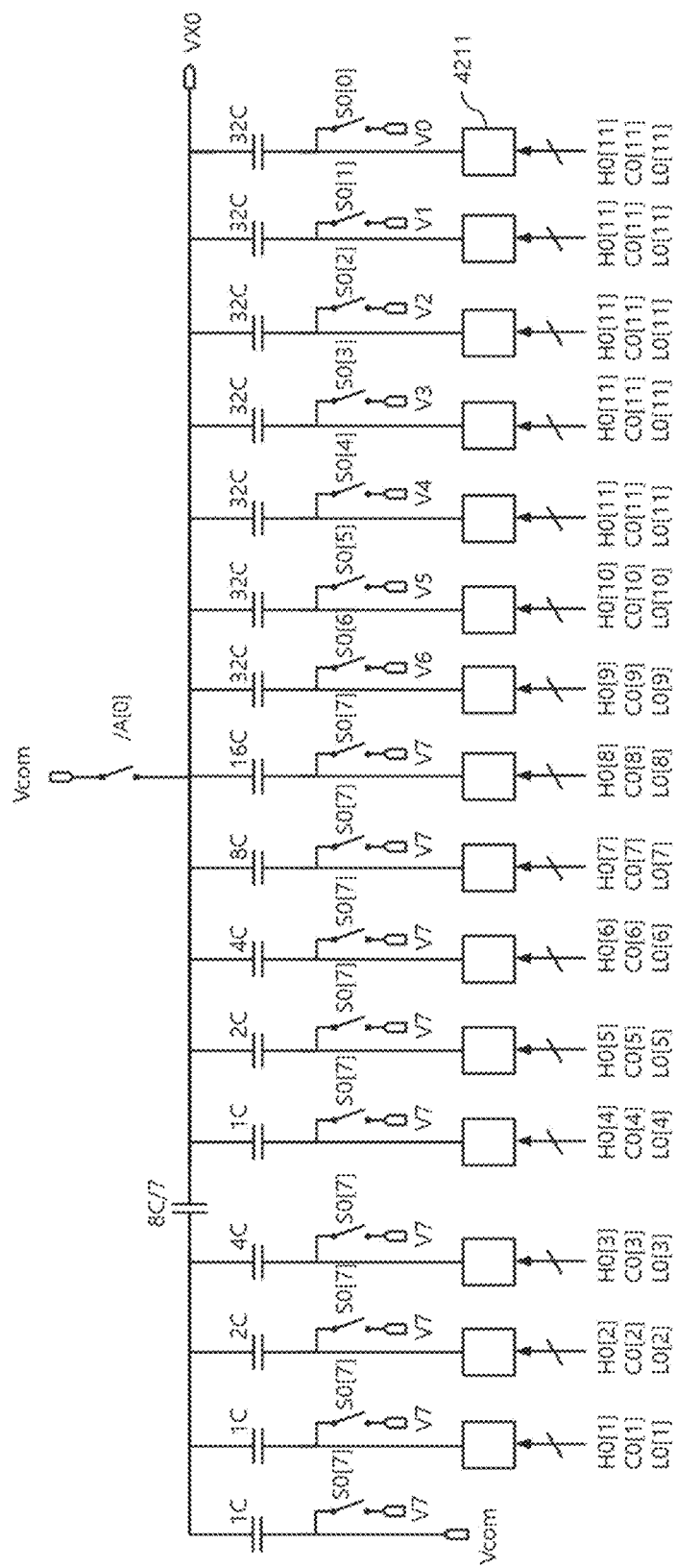
FIG. 4 is a circuit diagram illustrating a signal storage circuit of FIG. 3.
Figure 5:
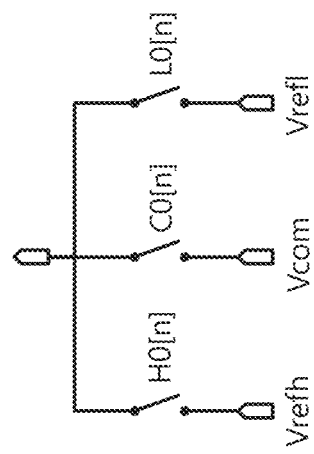
FIG. 5 is a circuit diagram of a switch box of FIG. 4.

FIG. 4 is a circuit diagram illustrating a sub-signal storage circuit 421 included in a signal storage circuit 420 of FIG. 3 and FIG. 5 is a circuit diagram of a switch box 4211 of FIG. 4.

The capacitors of the sub-signal storage circuit 421 are connected in a network form as shown in FIG. 4. Such a structure of a capacitor network may be modified according to embodiments.

While a signal is being stored, i.e., during the sampling operation, the first control circuit 410 deactivates the selection signal A[0], thereby fixing the output terminal of the capacitor network to the reference voltage Vcom.

Also, all of H0[11:1], C0[11:1], and L0[11:1] are deactivated. Accordingly, all switches of the switch box 4211 are opened as shown in FIG. 5.

If necessary, both ends of the capacitor are set to the same reference voltage Vcom to fully discharge charges by activating C0[11:1] with H0[11:1] and L0[11:1] inactivated before all of H0[11:1], C0[11:1], and L0[11:1] are deactivated.

The capacitor network controls the voltage input switch in accordance with the input control signal S0[7:0] to store charge according to the voltage difference between the analog voltages V0 to V7 and the common voltage Vcom therein.

At this time, the input control signal S0[7:0] may be determined by the first control circuit 410 according to the delay information provided by the controller 230 of FIG. 2. For example, the input control signal may be provided as shown in FIG. 6.

Figure 6:
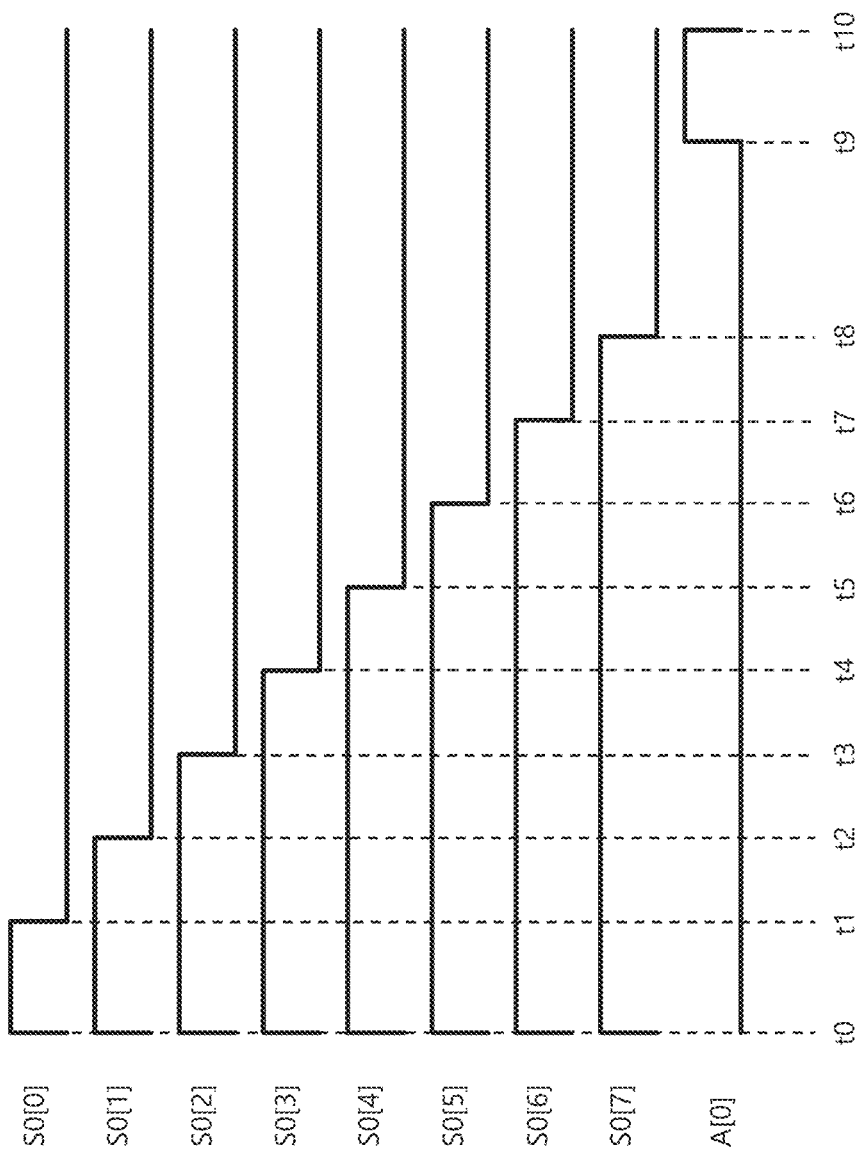
FIG. 6 is a timing diagram illustrating an operation of a first control circuit of FIG. 3.

FIG. 6 is a timing diagram illustrating an operation of a first control circuit 410.

The timing diagram of FIG. 6 assumes that the ultrasonic waves received by the first channel to the eighth channel are sequentially delayed as shown in FIG. 8.

At the beginning of the sampling operation t0, all the bits of the input control signal S0 are activated.

The corresponding bits of the input control signal S0 are sequentially deactivated at times t1 to t8 when a signal input from each channel is terminated.

When the sampling operation is completed after t8, a selection signal A[0] is activated at t9 to separate the output terminal of the sub-signal storage circuit 421 from the reference voltage Vcom.

The interval between t8 and t9 is an idle interval, and its length can be increased or decreased according to embodiments.

When all of the analog voltages V0 to V7 are received and the charging is completed in the capacitor network, the first control circuit 410 activates the selection signal A[0] so that the output terminal of the sub-signal storage circuit 421 may not be fixed as the reference voltage Vcom.

Thereby, the sampling operation is completed, and the capacitors of the sub-signal storage circuit 421 are charged with predetermined charges corresponding to the analog voltages V0 to V7.

This state can be understood as a state in which the analog beam signal is stored in the sub-signal storage circuit 421.

The second control circuit 430 then controls the analog-to-digital conversion operation. For example, in an interval between t9 and t10 of FIG. 6, the second control circuit 430 may control an operation for converting the analog beam signal obtained as a result of the sampling operation into a digital signal.

The second control circuit 430 may refer to the value of the selection signal A[7:0] to identify a sub-signal storage circuit 421 to perform an analog-to-digital conversion.

Figure 7:
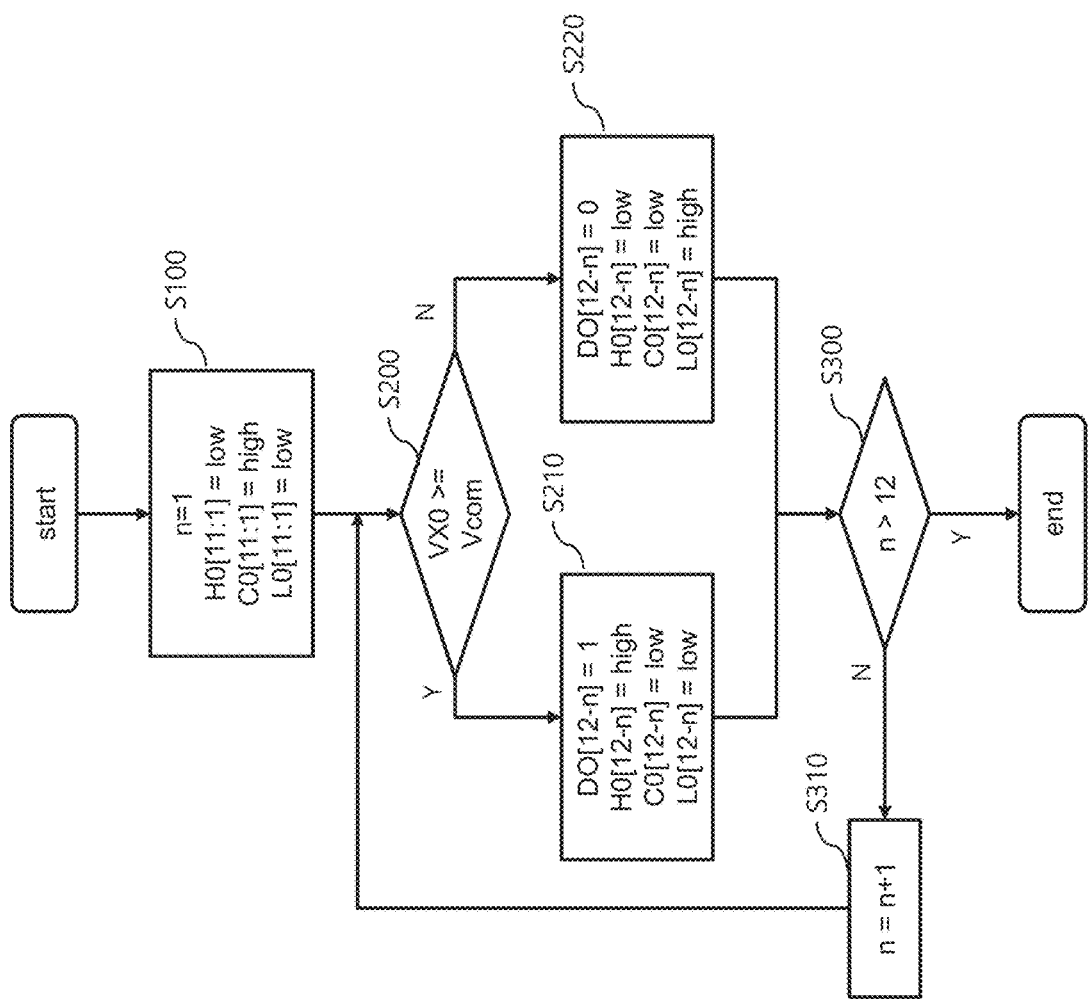
FIG. 7 is a flow chart illustrating an operation of the second control circuit of FIG. 3.

FIG. 7 is a flow chart illustrating an operation of the second control circuit 430 of FIG. 3.

It is assumed that a digital signal DO has a total of 12 bits in this embodiment.

First, at step S100, the second control circuit 430 initializes the index n to 1, deactivates H0[11:1] and L0[11:1], and activates C0[11:1] applied to the switch box 4211.

Thereby a terminal of each capacitor to the reference voltage Vcom. Accordingly, the charge redistribution occurs in the capacitors of the sub-signal storage circuit 421.

The output voltage VX0 by the charge redistribution at the sub-signal storage circuit 421 is determined according to the following equation 1.

$$VX0 = \frac{V0 + V1 + V2 + V3 + V4 + V5 + V6 + V7}{8} \quad \text{[Equation 1]}$$

At the next step S200, the output voltage VX0 is compared with the reference voltage Vcom.

If the comparison result indicates that the output voltage VX0 is greater than or equal to the reference voltage Vcom, the process proceeds to step S210, and if not, the process proceeds to step S220.

At step S210, the (12-$n$)-th bit of the output signal D0 is set to 1, the H0[12-$n$] signal is set to high, the C0[12-$n$] signal and the L0[12-$n$] signals are set to low. Accordingly, one terminal of the capacitor associated with the (12-$n$)-th signal is fixed to the high voltage Vrefh.

In step S220, the (12-$n$)-th bit of the output signal D0 is set to 0, the L0[12-$n$] signal is set to high, the C0[12-$n$] signal and the H0[12-$n$] are set to low. Accordingly, one end of the capacitor associated with the (12-$n$)-th signal is fixed to the low voltage Vrefl.

In this embodiment, the reference voltage Vcom is an intermediate voltage between the high voltage Vrefh and the low voltage Vrefl.

After performing steps S210 and S220, the output voltage VX0 of the sub-signal storage circuit 421 is updated by charge redistribution.

For example, when n=1, the output voltage VX0 is given by the following equation 2 if the step S210 is performed, and the output voltage VX0 is calculated by the following equation 3 if the step S220 is performed.

$$VX0 = \frac{V0 + V1 + V2 + V3 + V4 + V5 + V6 + V7}{8} + \frac{Vcom}{2} \quad \text{[Equation 2]}$$

$$VX0 = \frac{V0 + V1 + V2 + V3 + V4 + V5 + V6 + V7}{8} - \frac{Vcom}{2} \quad \text{[Equation 3]}$$

At step S300, it is checked whether the index n exceeds 12.

If the index n does not exceed 12, the index n is incremented by 1 at step S310 and the process of step S200 and subsequent steps is repeated.

When the index n exceeds 12, the operation is terminated since all bits of the output signal D0 have been determined.

The second control circuit 430 may further include a register for temporarily storing the digital signal until it is completed.

FIG. 8 is a diagram illustrating an operation of a beam forming device according to an embodiment of the present disclosure.

FIG. 8 shows a situation in which a reflected signals are received with a predetermined time interval T when emitting a series of ultrasonic waves to the target point F.

In FIG. 8, it is assumed that delay of the signals reflected from the target point F increases from channel 1 to channel 8.

As described above, delay information of a signal according to a channel may be stored in advance in the LUT 240 of FIG. 2 in association with the target point F.

In FIG. 8, the reflected ultrasonic wave signal is represented by Zij, where i is a channel number and j is a serial number of the wave signal or a number of a group to which the wave signal belongs, and a corresponding analog voltage signal is represented by Vij.

Figure 9:
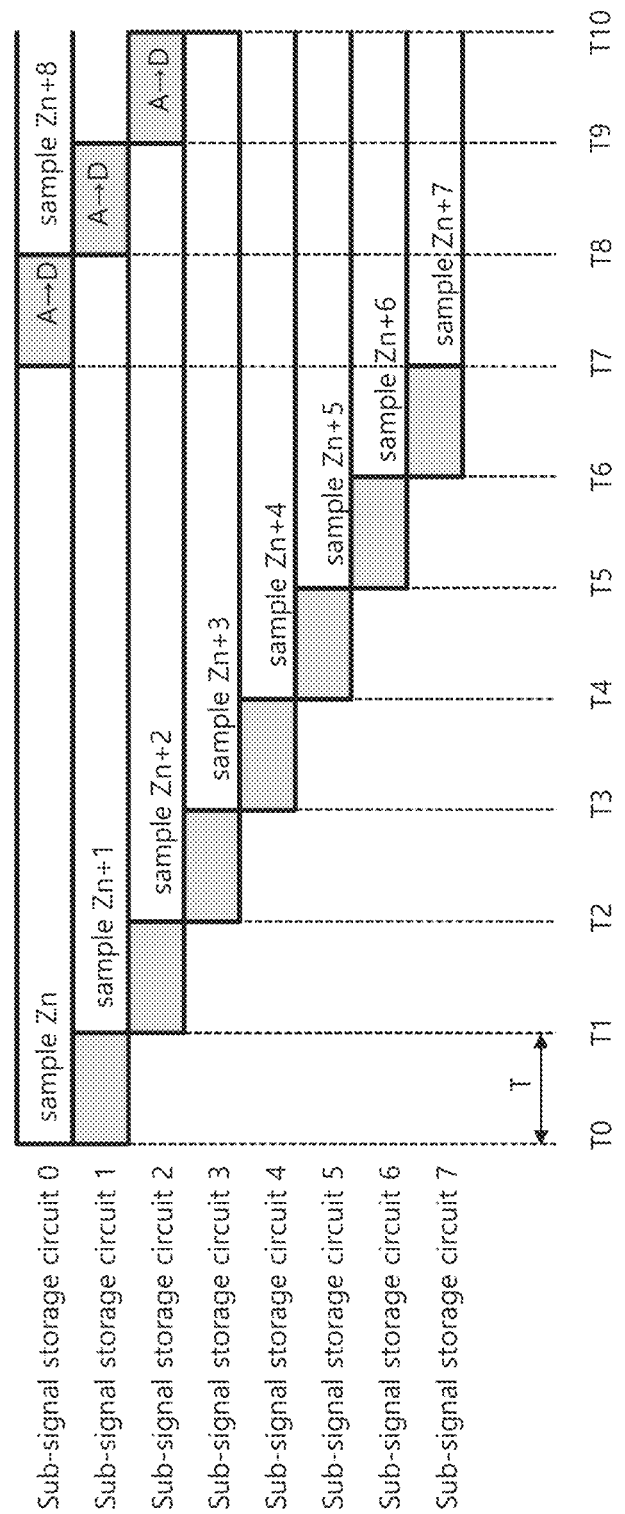
FIG. 9 is a timing diagram illustrating an operation of a beam forming device of FIG. 8.

FIG. 9 is a timing diagram illustrating an operation of a beam forming device of FIG. 8 and shows a case performing a sampling operation and an analog-to-digital conversion operation according to a time interleaving method.

FIG. 9 shows an operation of sampling a series of ultrasonic waves signal using eight sub-signal storage circuits 421 and converting the result into a digital signal.

At this time, the sampling refers to an operation of charging a corresponding capacitor of FIG. 4 using the analog signals output through each channel, which corresponds to the analog beam forming operation.

In FIG. 9, Zn represents the n-th reflected ultrasonic wave signal.

The 0th sub-signal storage circuit samples the nth ultrasonic signal Zn from T0 to T7 and converts the nth ultrasonic wave signal sampled from T7 to T8 to a digital signal.

The first sub-signal storage circuit samples the (n+1)-th ultrasonic signal Zn+1 from T1 to T8 and converts the (n+1)-th ultrasonic signal sampled from T8 to T9 to a digital signal.

The second sub-signal storage circuit to the second sub-signal storage circuit perform operations similar to the above circuits as shown in FIG. 9.

The selection signal A[m] (m=0, 1, 2, . . . , 7) shown in FIGS. 3 and 4 is deactivated during the sampling operation as described above and the selection signal A[i] is activated during the analog-to-digital conversion operation.

For example, while the sampling operation is being performed at T0 to T7, the input control signal S0[k] (k=0, 1, 2, . . . , 7) of FIGS. 3 and 4 is activated while a signal is input from a corresponding channel as shown in FIG. 7 and the input control signal S0[k] is deactivated while a signal is not input from a corresponding channel.

As shown in FIGS. 8 and 9, a series of ultrasonic wave signals reflected with a constant time interval can be processed in parallel according to a time interleaving method using a plurality of sub-signal storage circuits, thereby improving the signal processing speed. This helps to obtain diagnostic images in real time.

Although various embodiments have been described for illustrative purposes, it will be apparent to those skilled in the art that various changes and modifications may be made without departing from the spirit and scope of the disclosure as defined in the following claims.

For example, although an ultrasound diagnostic system including a beam forming device has been described above, the ultrasonic diagnostic system is an example of a system including a beam forming device according to the present invention and the scope of the present invention is not limited to an ultrasonic diagnostic system.

The invention claimed is:

1. A beam forming device comprising:
a signal storage circuit configured to receive a plurality of analog signals to store an analog beam signal corresponding to a combination of the plurality of analog signals; and
a control circuit configured to control the signal storage circuit so that the signal storage circuit receives the plurality of analog signals and stores the analog beam signal, to generate a digital signal corresponding to the analog beam signal and to control the signal storage circuit so that an output voltage of the signal storage circuit is updated while the digital signal is being generated.

2. The beam forming device of claim 1, wherein the control circuit comprises:
a first control circuit configured to control the signal storage circuit so that the signal storage circuit receives the plurality of analog signals and stores the analog beam signal; and
a second control circuit configured to control the signal storage circuit to generate an output voltage corresponding to the analog beam signal.

3. The beam forming device of claim 2, wherein the first control circuit controls the signal storage circuit so that the plurality of analog signals are input at an interval while the plurality of analog signals are valid.

4. The beam forming device of claim 1, further comprising a comparator configured to compare an output voltage of the signal storage circuit with a reference voltage, wherein the control circuit controls the signal storage circuit so that the signal storage circuit updates the output voltage according to a comparison result of the comparator.

5. The beam forming device of claim 1, wherein the signal storage circuit comprises one or more sub-signal storage circuits, each of which receives a group of analog signals and stores an analog beam signal corresponding to a combination of the group of analog signals.

6. The beam forming device of claim 5, where the signal storage circuit further comprises a selection circuit configured to provide an output among outputs of the one or more sub-signals storage circuits to an external circuit by the control of the control circuit.

7. The beam forming device of claim 5, wherein the control circuit controls the one or more sub-signal storage circuits so that the one or more sub-signal storage circuits store a group of analog signals each of which is distinguished from one another.

8. The beam forming device of claim 6, wherein the control circuit controls the selection circuit so that a sub-signal storage circuit which finished storing an analog beam signal is selected among the one or more sub-signal storage circuits.

9. The beam forming device of claim 8, wherein the control circuit controls the signal storage circuit so that an analog beam signal of a selected sub-signal storage circuit is converted to a digital signal.

10. The beam forming device of claim 6, wherein each of the one or more sub-signal storage circuits comprises:
a capacitor network configured to store an analog beam signal corresponding to the group of analog signals;
a plurality of voltage input switches configured to receive the group of analog signals to the capacitor network by control of the control circuit; and
a plurality of switch boxes configured to provide a fixed voltage to the capacitor network, wherein a level of the fixed voltage is selected by a control of the control circuit.

11. The beam forming device of claim 10, further comprising a comparator configured to compare an output voltage of the signal storage circuit with a reference voltage and wherein the control circuit controls a part of the plurality of switch boxes to update the output voltage of the signal storage circuit according to a comparison result of the comparator.

12. The beam forming device of claim 11, wherein each of the plurality of switch boxes provides a higher level voltage than the reference voltage or a lower level voltage than the reference voltage according to the comparison result.

13. The beam forming device of claim 11, wherein the control circuit determines a part of a digital signal corresponding to the analog beam signal according to the comparison result.

14. A probe system comprising:
a plurality of transducers configured to convert signals received from a plurality of channels to a plurality of analog signals; and
a beam forming device configured to receive the plurality of analog signals and to output a digital signal which is a conversion of an analog beam signal corresponding to a combination of the plurality of analog signals,
wherein the beam forming device comprises:
a signal storage circuit configured to receive the plurality of analog signals to store the analog beam signal corresponding to a combination of the plurality of analog signals; and a control circuit configured to control the signal storage circuit so that the signal storage circuit receives the plurality of analog signals and stores the analog beam signal, to generate a digital signal corresponding to the analog beam signal and to control the signal storage circuit so that an output voltage of the signal storage circuit is updated while the digital signal is being generated.

15. The probe system of claim 14, further comprising:
a plurality of analog signal regulators configured to adjust outputs of the plurality of transducers.

16. The probe system of claim 14, wherein the control circuit comprises:
a first control circuit configured to control the signal storage circuit so that the signal storage circuit receives the plurality of analog signals and stores the analog beam signal; and
a second control circuit configured to control the signal storage circuit to generate an output voltage corresponding to the analog beam signal.

17. The probe system of claim 14, wherein the signal storage circuit comprises one or more sub-signal storage circuits, each of which receives a group of analog signals and stores an analog beam signal corresponding to a combination of the group of analog signals.

18. The probe system of claim 17, where the signal storage circuit further comprises a selection circuit configured to provide an output among outputs of the one or more sub-signals storage circuits to an external circuit by the control of the control circuit.

19. The probe system of claim 18, wherein each of the one or more sub-signal storage circuits comprises:
a capacitor network configured to store an analog beam signal corresponding to the group of analog signals;
a plurality of voltage input switches configured to receive the group of analog signals to the capacitor network by control of the control circuit; and
a plurality of switch boxes configured to provide a fixed voltage to the capacitor network, wherein a level of the fixed voltage is selected by a control of the control circuit.

20. The probe system of claim 19, wherein the beam forming device further comprises a comparator configured to compare an output voltage of the signal storage circuit with a reference voltage and wherein the control circuit controls a part of the plurality of switch boxes to update the output voltage of the signal storage circuit according to a comparison result of the comparator.

21. A system comprising:
a probe including a plurality of transducers configured to convert signals received from a plurality of channels to a plurality of analog signals; and a plurality of beam forming device each configured to receive the plurality of analog signals and to output a digital signal which is a conversion of an analog beam signal corresponding to a combination of the plurality of analog signals;
a cable configured to transmit a digital signal output from the probe; and
a main body configured to analyze the digital signal received through the cable,
wherein one of the plurality of beam forming devices comprises:

a signal storage circuit configured to receive the plurality of analog signals to store the analog beam signal corresponding to a combination of the plurality of analog signals; and
a control circuit configured to control the signal storage circuit so that the signal storage circuit receives the plurality of analog signals and stores the analog beam signal, to generate a digital signal corresponding to the analog beam signal and to control the signal storage circuit so that an output voltage of the signal storage circuit is updated while the digital signal is being generated.

22. The system of claim 21, further comprising:
a plurality of analog signal regulators configured to adjust outputs of the plurality of transducers.

23. The system of claim 21, wherein the control circuit comprises:
a first control circuit configured to control the signal storage circuit so that the signal storage circuit receives the plurality of analog signals and stores the analog beam signal; and
a second control circuit configured to control the signal storage circuit to generate an output voltage corresponding to the analog beam signal.

24. The system of claim 21, wherein the signal storage circuit comprises one or more sub-signal storage circuits, each of which receives a group of analog signals and stores an analog beam signal corresponding to a combination of the group of analog signals.

25. The system of claim 24, where the signal storage circuit further comprises a selection circuit configured to provide an output among outputs of the one or more sub-signals storage circuits to an external circuit by the control of the control circuit.

26. The system of claim 25, wherein each of the one or more sub-signal storage circuits comprises:
a capacitor network configured to store an analog beam signal corresponding to the group of analog signals;
a plurality of voltage input switches configured to receive the group of analog signals to the capacitor network by control of the control circuit; and
a plurality of switch boxes configured to provide a fixed voltage to the capacitor network, wherein a level of the fixed voltage is selected by a control of the control circuit.

27. The system of claim 26, wherein the beam forming device further comprises a comparator configured to compare an output voltage of the signal storage circuit with a reference voltage and wherein the control circuit controls a part of the plurality of switch boxes to update the output voltage of the signal storage circuit according to a comparison result of the comparator.

28. The system of claim 21, wherein the plurality of analog signals are activated with time or phase differences, and wherein the control circuit controls the signal storage circuit so that the time or phase differences are removed and the plurality of analog signals are input at a time interval when the plurality of analog signals are valid.

29. The system of claim 28, wherein the main body comprises a look-up table (LUT) storing the time or phase differences and a controller configured to provide the time or phase differences to the beam forming device.

* * * * *